United States Patent
Shur et al.

(10) Patent No.: US 10,186,632 B2
(45) Date of Patent: Jan. 22, 2019

(54) DEEP ULTRAVIOLET LIGHT EMITTING DIODE

(71) Applicant: Sensor Electronic Technology, Inc., Columbia, SC (US)

(72) Inventors: Michael Shur, Latham, NY (US); Remigijus Gaska, Columbia, SC (US); Jinwei Yang, Columbia, SC (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/645,363

(22) Filed: Jul. 10, 2017

(65) Prior Publication Data

US 2017/0309776 A1    Oct. 26, 2017

Related U.S. Application Data

(63) Continuation of application No. 15/069,249, filed on Mar. 14, 2016, now Pat. No. 9,705,032, which is a continuation-in-part of application No. 14/184,741, filed on Feb. 20, 2014, now Pat. No. 9,287,455, which is a continuation-in-part of application No.
(Continued)

(51) Int. Cl.
| | |
|---|---|
| H01L 33/02 | (2010.01) |
| H01L 33/04 | (2010.01) |
| H01L 33/10 | (2010.01) |
| H01L 33/14 | (2010.01) |

(Continued)

(52) U.S. Cl.
CPC ............. H01L 33/06 (2013.01); H01L 33/04 (2013.01); H01L 33/325 (2013.01); H01L 33/025 (2013.01); H01L 33/10 (2013.01); H01L 33/14 (2013.01); H01L 33/32 (2013.01)

(58) Field of Classification Search
CPC ..... H01L 29/15; H01L 29/156; H01L 33/007; H01L 33/04; H01L 33/06; H01L 33/025; H01L 33/10; H01L 33/14; H01L 33/145; H01L 33/32; H01L 33/325
See application file for complete search history.

(56) References Cited

U.S. PATENT DOCUMENTS 7,619,238 B2    11/2009    Gaska et al.
7,812,946 B1    10/2010    Killinger et al.
(Continued)

FOREIGN PATENT DOCUMENTS

WO    2011109693 A2    9/2011

OTHER PUBLICATIONS

Clough, et al., "Polycrystalline silicon thin film transistor incorporating a semi-insulating field plate for high voltage circuitry on glass," Oct. 6, 1997, 4 pages, vol. 71, No. 14.
(Continued)

*Primary Examiner* — Cheung Lee
*Assistant Examiner* — Stephen C Smith
(74) *Attorney, Agent, or Firm* — LaBatt, LLC

(57) ABSTRACT

A carbon doped short period superlattice is provided. A heterostructure includes a short period superlattice comprising a plurality of quantum wells alternating with a plurality of barriers. One or more of the quantum wells and/or the barriers includes a carbon doped layer (e.g., a non-percolated or percolated carbon atomic plane).

20 Claims, 9 Drawing Sheets

Related U.S. Application Data

13/623,381, filed on Sep. 20, 2012, now Pat. No. 8,791,450.

(60) Provisional application No. 61/768,708, filed on Feb. 25, 2013, provisional application No. 61/538,122, filed on Sep. 22, 2011.

(51) Int. Cl.
*H01L 33/06* (2010.01)
*H01L 33/32* (2010.01)

(56) References Cited

U.S. PATENT DOCUMENTS

| | | | |
|---|---|---|---|
| 8,409,366 | B2 | 4/2013 | Ogihara et al. |
| 8,436,383 | B2 | 5/2013 | Jung |
| 8,536,615 | B1 | 9/2013 | Driscoll et al. |
| 8,580,658 | B1 | 11/2013 | Davis |
| 8,791,450 | B2 * | 7/2014 | Shur .................. H01L 33/06 257/103 |
| 9,287,455 | B2 | 3/2016 | Shur et al. |
| 9,705,032 | B2 | 7/2017 | Shur et al. |
| 2005/0017251 | A1 | 1/2005 | Vinciguerra et al. |
| 2007/0008998 | A1 | 1/2007 | Ohta et al. |
| 2009/0302310 | A1 | 12/2009 | Rinzler et al. |
| 2010/0032647 | A1 | 2/2010 | Khan et al. |
| 2011/0012089 | A1 | 1/2011 | Khan et al. |
| 2011/0309326 | A1 | 12/2011 | Gaska et al. |
| 2013/0193408 | A1 | 8/2013 | Hwang et al. |
| 2014/0339598 | A1 * | 11/2014 | Park .................. H01L 33/325 257/101 |

OTHER PUBLICATIONS

Davidson, et al., "Characterization of carbon delta-doping GaAs superlattices grown by chemical beam epitaxy using CBr4," Journal of Crystal Growth, 1996, 6 pages, and vol. 164, Nos. 383-388.

Goud et al., "Analysis and Optimal Design of Semi-Insulator Passivated High-Voltage Field Plate Structures and Comparison with Dielectric Passivated Structures," Oct. 1994, 10 pages, vol. 41, No. 10.

Joyce, et al., "Carbon delta doping in chemical beam epitaxy using CBr4," Journal of Crystal Growth, 1997, 6 pages, vols. 175/176, Nos. 377-382.

Kawanishi, H., "Carbon-doped p-type (0001) plane AlGaN (Al=0.06 to 0.55) with high hole density," Abstracts of 9th International Conference on Nitride Semiconductors, B3.2, Glasgow, UK, Jul. 10-15, 2011 and 9 pages.

Nakarmi, et al., "Enhanced p-type conduction in GaN and AlGaN by Mg-doping," Applied Physics Letters, May 2003, 4 pages, vol. 82, No. 18.

Poblenz, et al. "Effect of carbon doping on buffer leakage in AlGaN/GaN high electron mobility transistors," Journal of Vacuum Science and Technoly B, 2004, 6 pages, vol. 22.

Sakurai, et al., "Electronic properties of graphene and borono-nitride based nanostrucured materials," Journal of Physics: Conference Series 302, Aug. 8, 2011, 6 pages.

Sattu, et al., "AlGaN/GaN Microwave Switch With Hybrid Slow and Fast Gate Design," Dec. 2010, 3 pages, vol. 31, No. 12.

Shatalov, et al., "Efficiency of light emission in high aluminum content AlGaN quantum wells," Journal of Applied Physics, 2009, 6 pages, vol. 105, No. 073103.

Shur, et al., "Deep Ultraviolet Light Emitting Diodes" (Invited/Review Paper), IEEE Trans. ED, 2010, 14 pages, vol. 57, No. 1.

Winking, et al., "Ideal delta doping of carbon in GaAs," Journal of Vacuum Science & Technology B: Microelectronics and Nanometer Structures, Jan. 2005, 5 pages, vol. 23, No. 267.

Smith, U.S. Appl. No. 14/184,741, Notice of Allowance1, dated Nov. 12, 2015, 8 pages.

Smith, U.S. Appl. No. 14/184,741, Office Action 1, dated May 11, 2015, 23 pages.

Smith, U.S. Appl. No. 13/623,381, Notice of Allowance, dated Mar. 21, 2014, 13 pages.

Smith, U.S. Appl. No. 13/623,381, Office Action2, dated Jan. 6, 2014, 14 pages.

Smith, U.S. Appl. No. 13/623,381, Office Action1, dated Sep. 13, 2013, 19 pages.

Smith, S. U.S. Appl. No. 15/069,249, Notice of Allowance, dated Mar. 13, 2017, 8 pages.

Smith, S. U.S. Appl. No. 15/069,249, Final Office Action 1, dated Nov. 25, 2016, 10 pages.

Smith, S. U.S. Appl. No. 15/069,249, Office Action 1, dated Jun. 15, 2016, 20 pages.

\* cited by examiner

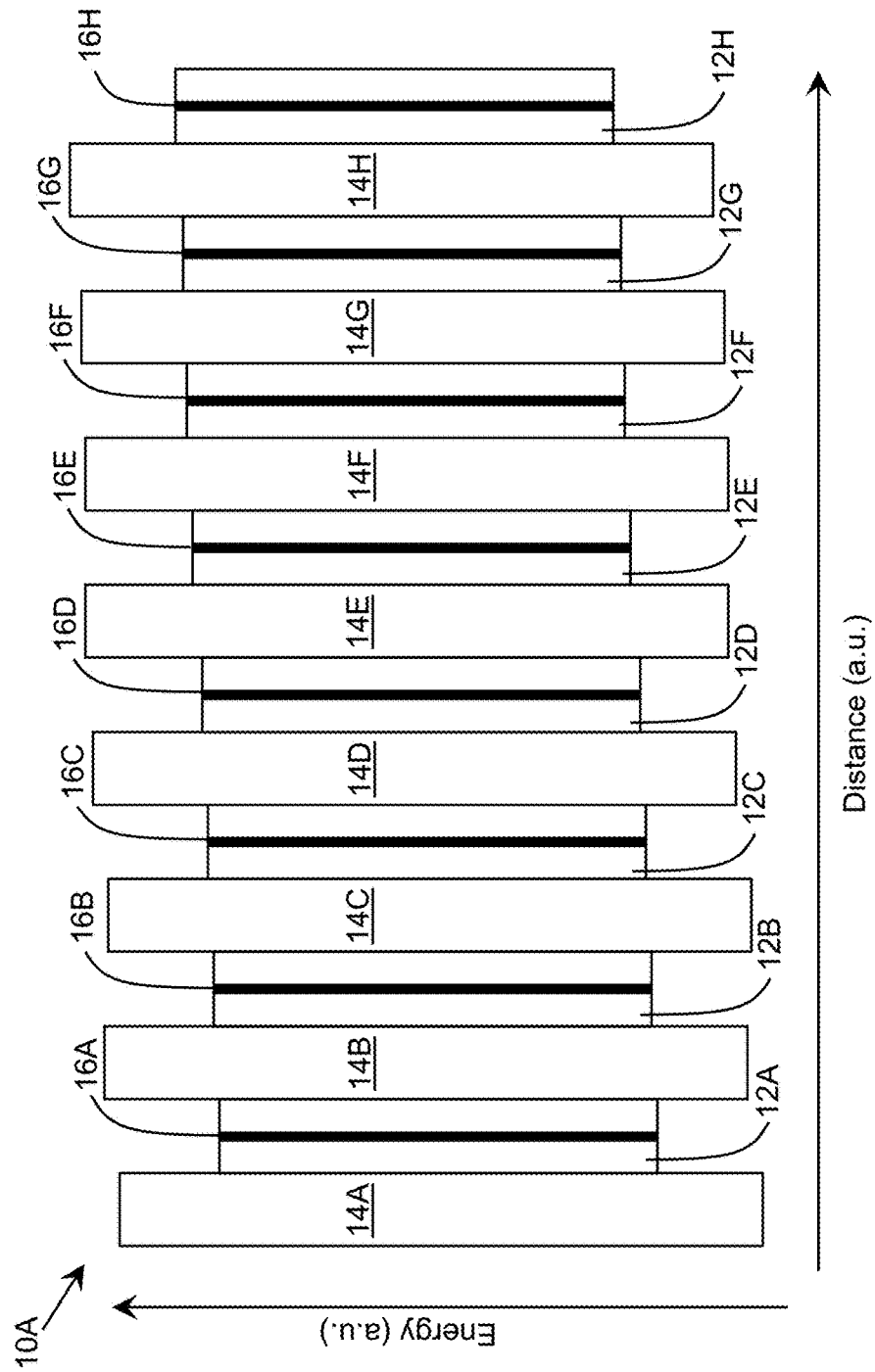

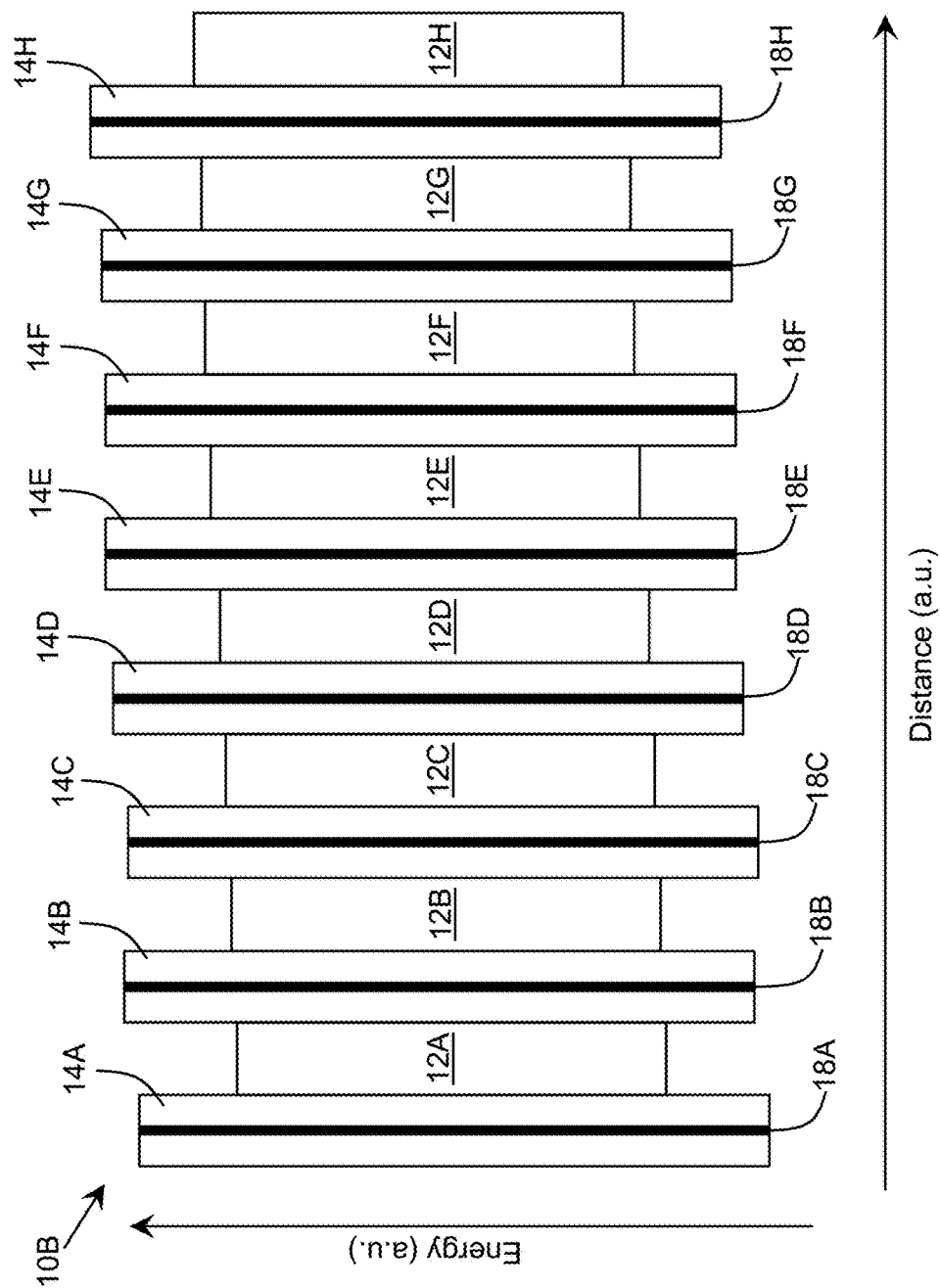

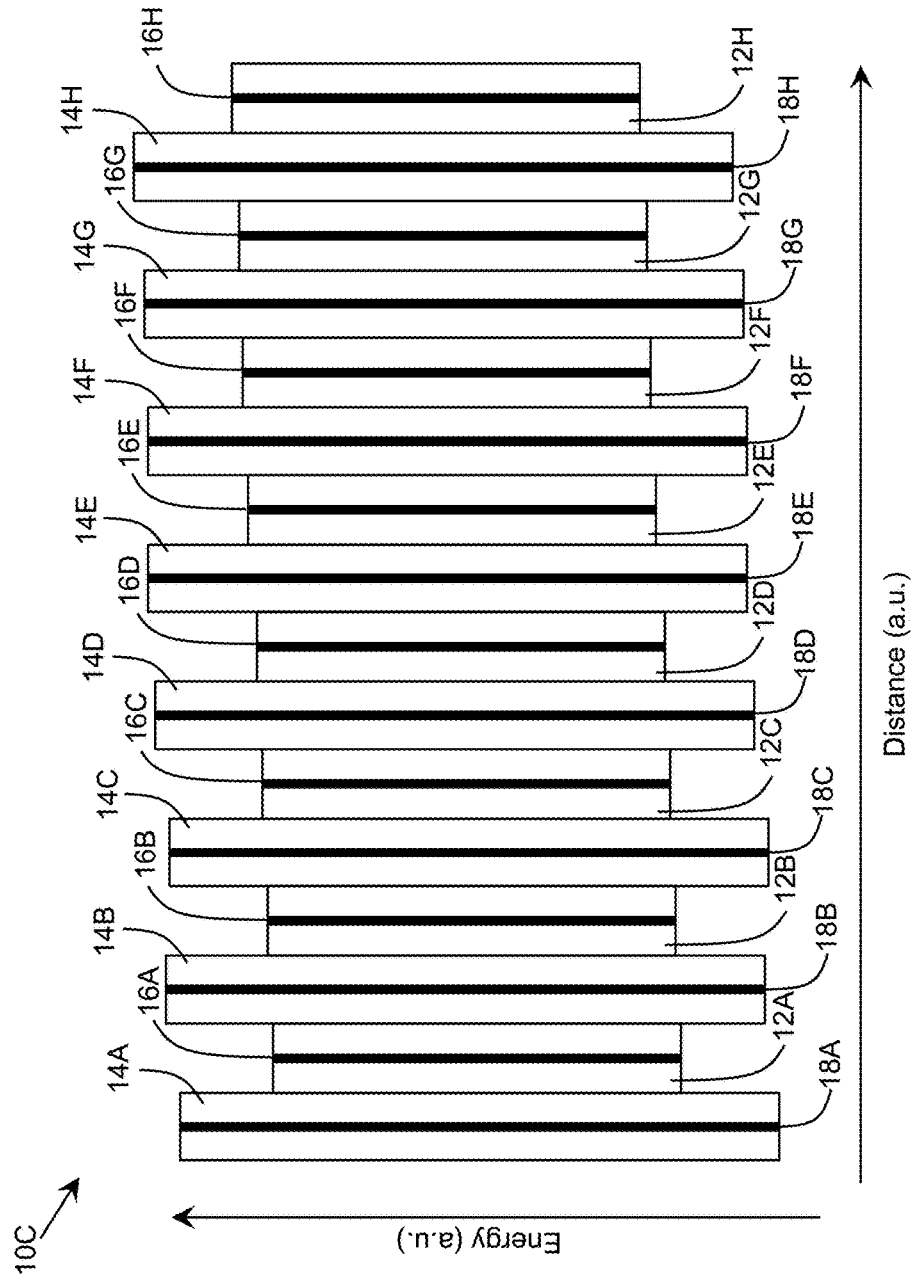

| P-Type Contact | 38 |
| DBR Structure | 40 |
| Electron Blocking Layer | 42 |
| Light Generating Structure | 36 |
| N-Type Contact | 34 |
| Substrate | 32 |

| P-Type Contact | 38 |
| Electron Blocking Layer | 42 |
| Stress Relieving Layer | 54 |
| Light Generating Structure | 36 |
| N-Type Contact | 34 |
| Buffer Layer | 52 |
| Substrate | 32 |

DEEP ULTRAVIOLET LIGHT EMITTING DIODE

REFERENCE TO RELATED APPLICATIONS

The current application is a continuation of U.S. patent application Ser. No. 15/069,249, filed 14 Mar. 2016, which is a continuation-in-part of U.S. application Ser. No. 14/184,741, filed on 20 Feb. 2014, which claims the benefit of U.S. Provisional Application No. 61/768,708, filed on 25 Feb. 2013, and which is also a continuation-in-part of U.S. application Ser. No. 13/623,381, filed on 20 Sep. 2012, which claims the benefit of U.S. Provisional Application No. 61/538,122, filed on 22 Sep. 2011, each of which is hereby incorporated by reference.

TECHNICAL FIELD

The disclosure relates generally to short period superlattices, and more particularly, to an improved doping approach for short period superlattices.

BACKGROUND ART

Emerging deep ultraviolet light emitting diodes (DUV LEDs) cover the ultraviolet (UV) range down to 210 nanometers (nm), and provide output powers already sufficient for many applications. Additionally, these devices have high modulation frequencies, low noise, flexible form factor and spectral and space power distribution, high internal quantum efficiency, and a potential to achieve high wall plug efficiency. For example, photoluminescence (PL) studies and ray tracing calculations show that the achieved internal quantum efficiency for a 280 nm DUV LED may be quite high, e.g., between fifteen and seventy percent.

However, external quantum efficiency and wall plug efficiency of typical DUV LEDs is below three percent, with the highest efficiencies for 280 nm LEDs and lower efficiencies for LEDs emitting ultraviolet light having shorter wavelengths. Some reasons for the lower external and wall plug efficiencies include very low light extraction efficiency due to internal reflection from the sapphire substrate and sapphire/air interface, and strong absorption in the top low aluminum (Al)-content p-type aluminum gallium nitride (AlGaN) and p-type gallium nitride (GaN) layers. The efficiency of the LEDs is further reduced at higher currents and/or generated powers.

In UV LEDs emitting ultraviolet light having a shorter wavelength, the internal quantum efficiency also drops due to material problems resulting from growth of AlGaN structures with high Al content. Such growth, among other things, is complicated by the low mobility of Al adatoms, which can result in inhomogeneous Al composition and lateral phase separation, as well as high density of threading dislocations and point defects.

One approach to providing a nitride-based light emitting heterostructure that more efficiently generates and extracts light seeks to confine the light generating multiple quantum well structure in an energy "tub." However, such an approach is currently difficult to implement for short wavelength structures where the aluminum molar fraction is very high.

Controlling doping during the manufacture of many types of devices fabricated with wide band gap semiconductor materials is difficult. In particular, impurity levels for wide band gap semiconductor materials are deep and the activation of the impurities is inefficient, thereby making the doping more difficult to control. For example, FIG. 1 shows an illustrative fraction of activated impurities (Magnesium (Mg)) at 300 Kelvin (K) as a function of the impurity level in Aluminum Gallium Nitride (AlGaN) as shown in the prior art. As illustrated, for a Mg acceptor level in AlGaN of approximately 0.1 electron Volts (eV) above the ceiling of the valence band, only approximately one percent of the impurities are activated and supplying free holes. As a result, the conductivity of p-type AlGaN is severely limited, which is extremely detrimental to the performance of deep ultraviolet light emitting diodes (LEDs).

Polarization doping in GaN-on-AlGaN heterostructures has been shown to lead to the creation of a hole accumulation layer. For example, the polarization charge has been shown to induce a hole sheet density as high as $5 \times 10^{13}$ cm$^{-2}$ at an AlGaN/GaN heterointerface. The transition from a three-dimensional to a two-dimensional hole gas is achieved for hole sheet densities on the order of $10^{13}$ cm$^{-2}$ or higher. At lower hole sheet densities, only a three-dimensional hole accumulation layer may exist. This suggests that a two-dimensional hole gas induced by the polarization charge can be used to reduce the base spreading resistance in AlGaN/GaN-based heterostructure bipolar transistors and/or for p-channel group III nitride-based high electron mobility transistors (HEMTs).

FIG. 2 shows an illustrative band diagram of a metal/AlGaN/GaN heterostructure as shown in the prior art. In this case, the top GaN surface of the heterostructure comprises a nitrogen-terminated surface. In FIG. 2, the calculated two-dimensional charge density distribution includes piezoelectric and spontaneous polarization charges, a metal surface charge, and an accumulation hole charge for the heterostructure. The AlGaN layer comprises an Al molar fraction of approximately 0.25, and does not include donors. The GaN layer comprises an acceptor concentration, $N_a = 10^{17}$ cm$^{-3}$. The horizontal dashed line of FIG. 2 shows the Fermi level, and the holes occupy the energy states above this level. The two-dimensional hole gas provides a large lateral conductivity. However, as illustrated by FIG. 2, the conductance in a direction perpendicular to the two-dimensional hole gas is extremely small. The perpendicular conductance for the heterostructure is limited by the undoped or depleted wide band gap semiconductor layer, e.g., the AlGaN layer.

Carbon has been investigated as an alternative dopant for p-type AlGaN. Ideal delta doping of carbon was demonstrated for gallium arsenide (GaAs). Carbon delta-doped superlattices in GaAs have been successfully grown by chemical beam epitaxy with carbon tetrabromide (CBr$_4$) as the doping source. The carbon in GaAs demonstrated a high electrical activation ($3:5 \times 10^{13}$ cm$^{-2}$) and very narrow doping profiles (5° A) due to its high solubility and low diffusivity.

In GaN and AlGaN epilayers, enhancement of the p-type lateral and vertical conductivities has been achieved by employing Mg delta-doping. However, recently, a carbon-doped p-type (0001) plane AlGaN (Al=6% to 50%) with a high hole density has been demonstrated. A stable p-type conduction in the carbon-doped (0001) plane AlGaN was achieved with a large amount of Al (from 1% to 50%), but not in GaN with no Al in the composition. Maximum hole densities for the AlGaN layers with Al compositions of 6%, 10%, 25%, and 50% were approximately $(1-3) \times 10^{18}$ cm$^{-3}$. The "binding energy" of the carbon was approximately 26-30 meV for the carbon-doped p-type AlGaN with 10% of Al. As a result, carbon is a promising acceptor for AlGaN. However, the demonstrated hole densities are still too small for many device applications. Additionally, the expected hole mobilities values are extremely low.

SUMMARY OF THE INVENTION

Aspects of the invention provide a carbon doped short period superlattice. A heterostructure includes a short period superlattice comprising a plurality of quantum wells alternating with a plurality of barriers. One or more of the quantum wells and/or the barriers includes a carbon doped layer (e.g., a percolated carbon atomic plane).

A first aspect of the invention provides a group III nitride semiconductor heterostructure comprising: a short period superlattice comprising a plurality of quantum wells alternating with a plurality of barriers, wherein the plurality quantum wells comprise a semiconductor material having a first band gap and the plurality of barriers comprise a semiconductor material having a second band gap wider than the first band gap, and wherein at least one of: the plurality of quantum wells or the plurality of barriers comprises layers delta doped with carbon.

A second aspect of the invention provides a group III nitride semiconductor light emitting device comprising: a short period superlattice comprising a first plurality of sub-layers alternating with a second plurality of sub-layers, wherein the first plurality of sub-layers comprise a semiconductor material having a first band gap and the second plurality of sub-layers comprise a semiconductor material having a second band gap wider than the first band gap, and wherein at least one of: the first or second pluralities of sub-layers comprises sub-layers having regions delta doped with carbon and laterally adjacent regions including no carbon.

A third aspect of the invention provides a method of fabricating a light emitting diode, the method comprising: fabricating a group III nitride semiconductor heterostructure, the fabricating including forming a short period superlattice comprising a plurality of quantum wells alternating with a plurality of barriers, wherein the plurality quantum wells comprise a semiconductor material having a first band gap and the plurality of barriers comprise a semiconductor material having a second band gap wider than the first band gap, and wherein the forming at least one of: the plurality of quantum wells or the plurality of barriers includes delta doping with carbon.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 4A-4C show band gap diagrams of illustrative SPSLs illustrating inclusion of carbon delta doping according to embodiments.

FIGS. 6A and 6B show illustrative heterostructures for vertically conducting light emitting diodes according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a carbon doped short period superlattice. A heterostructure includes a short period superlattice comprising a plurality of quantum wells alternating with a plurality of barriers. One or more of the quantum wells and/or the barriers includes a carbon doped layer (e.g., a percolated or a non-percolated carbon atomic plane). As used herein, unless otherwise noted, the term "set" means one or more (i.e., at least one) and the phrase "any solution" means any now known or later developed solution.

Figure 1:
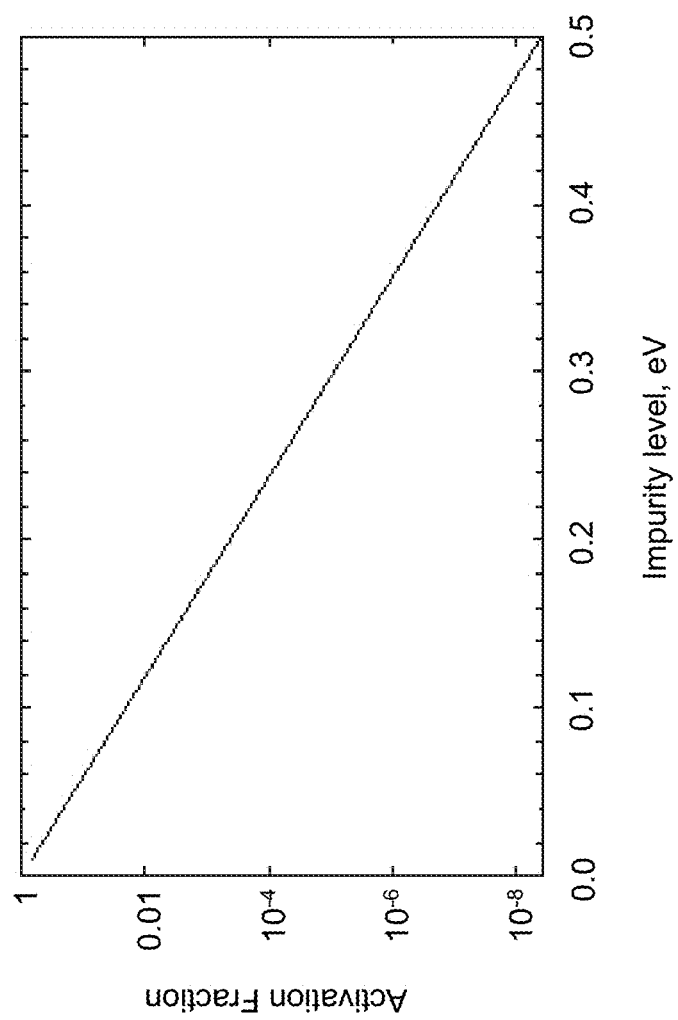
FIG. 1 shows an illustrative fraction of activated impurities as a function of the impurity level in AlGaN as shown in the prior art.
Figure 2:
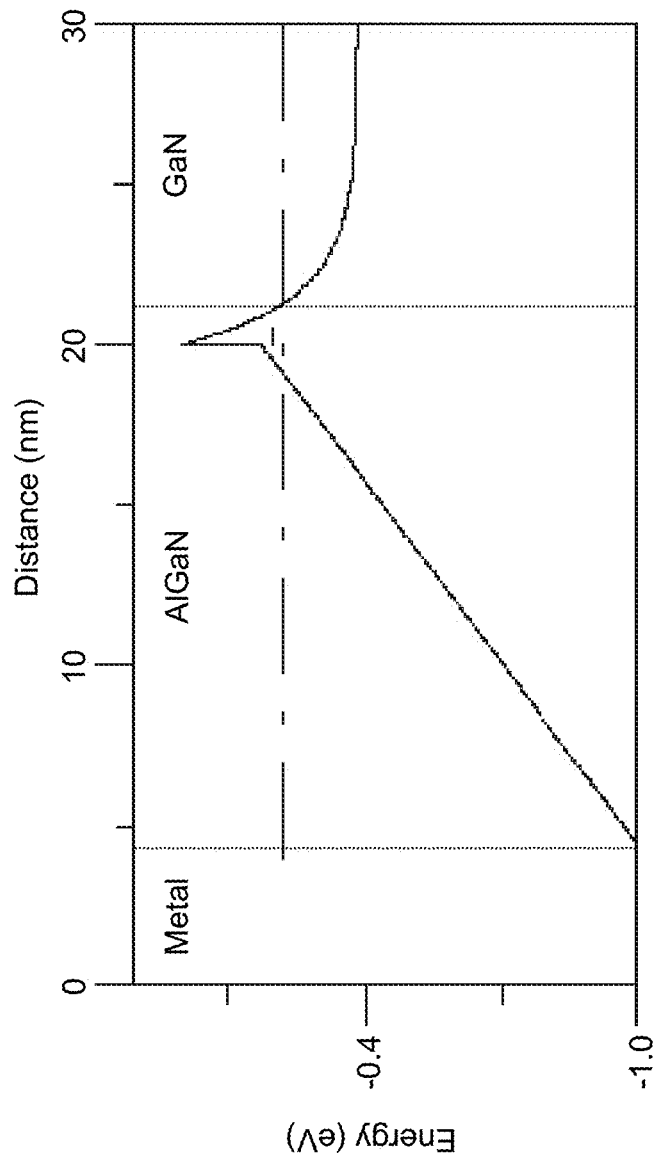
FIG. 2 shows an illustrative band diagram of a metal/AlGaN/GaN n-polar heterostructure as shown in the prior art.
Figure 3:
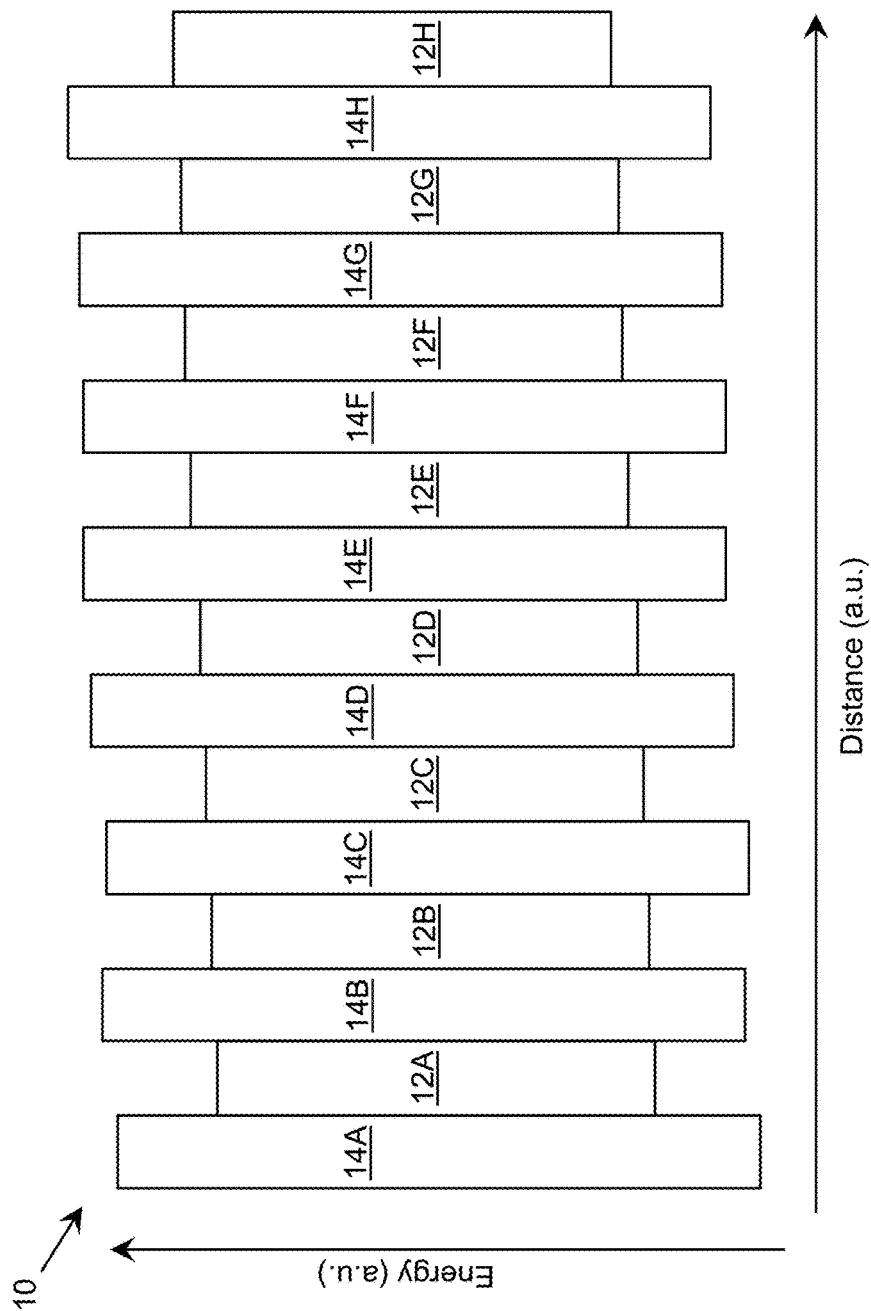
FIG. 3 shows a band gap diagram of an illustrative short period superlattice (SPSL).

Turning to the drawings, FIG. 3 shows a band gap diagram of an illustrative short period superlattice (SPSL) 10. For example, the SPSL 10 can be formed of alternating layers of compositions to form a plurality of quantum wells 12A-12H, each of which has a relatively small band gap, alternating with a plurality of barriers 14A-14H, each of which has a relatively large band gap. In an illustrative embodiment, the barriers 14 and quantum wells 12 are formed using differing wide band gap semiconductor materials, such as differing group III nitride material compositions. Group III nitride materials comprise one or more group III elements (e.g., boron (B), aluminum (Al), gallium (Ga), and indium (In)) and nitrogen (N), such that $B_WAl_XGa_YIn_ZN$, where $0 \le W, X, Y, Z \le 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements. In each case, a layer of a group III nitride material can include one or more dopants or delta-dopants, such as carbon, nitrogen, magnesium, and/or the like.

In a more specific illustrative embodiment, the SPSL 10 can be formed of alternating layers of AlGaN having varying content of Al and/or Ga. For example, each barrier 14A-14H can comprise an aluminum gallium nitride (AlGaN) composition having a molar fraction of aluminum that can be expressed as $Al_XGa_{1-X}N$, and each quantum well 12A-12H can comprise an AlGaN composition having a molar fraction of aluminum that can be expressed as $Al_YGa_{1-Y}N$. In a still more specific illustrative embodiment, each quantum well 12A-12H and barrier 14A-14H has a large aluminum molar fraction. Regardless, the differing compositions of the barriers 14A-14H and the quantum wells 12A-12H in the SPSL 10 form an alternating series of relatively small (quantum wells 12A-12H) and relatively large (barriers 14A-14H) band gaps.

In an embodiment, one or more of the quantum wells 12A-12H and/or the barriers 14A-14H can be delta doped with carbon. To this extent, FIGS. 4A-4C show band gap diagrams of illustrative SPSLs 10A-10C, respectively, illustrating inclusion of carbon delta doping according to embodiments. In FIG. 4A, each of the quantum wells 12A-12H includes carbon delta doping 16A-16H, respectively, while the barriers 14A-14H do not include any carbon delta doping. In FIG. 4B, each of the barriers 14A-14H includes carbon delta doping 18A-18H, respectively, while the quantum wells 12A-12H do not include any carbon delta doping. In FIG. 4C, each of the quantum wells 12A-12H includes carbon delta doping 16A-16H and each of the barriers 14A-14H includes carbon delta doping 18A-18H. An amount of doping and its coverage along the barrier/quantum well plane can vary, for example, depending on a composition of the corresponding barrier/quantum well. It is understood that the SPSLs 10A-10C are only illustrative of various combinations of carbon delta doping. For example, only a some of the quantum wells 12A-12H and/or barriers 14A-14H in an SPSL 10A-10C can include carbon delta doping. To this extent, an SPSL 10A-10C can include any combination of zero or more quantum wells 12A-12H and/or barriers 14A-14H, which includes carbon delta doping.

As illustrated, the carbon delta doping 16A-16H and/or the carbon delta doping 18A-18H can include the insertion of one or more carbon layers (e.g., planes) into the semiconductor structure (e.g., quantum well 12A-12H and/or barrier 14A-14H). In an embodiment, one or more of the carbon planes is a carbon atomic plane. In a further embodiment, one or more of the carbon planes is a graphene plane. In a still further embodiment, one or more of the graphene planes is a graphene atomic plane. Regardless, the carbon doped layer comprises one or more carbon domains. In a more specific embodiment, one or more of the carbon domains can include a monolayer graphene domain, which is a honeycomb arrangement of carbon atoms in a single plane. The monolayer graphene domain can be a size of approximately three lattice constants a, where lattice constant a is a lattice constant in the semiconductor basal plane (e.g., group III nitride). A thickness of the monolayer graphene domain can be comparable to the lattice constant a (e.g., a delta doping profile). In another embodiment, the carbon doped layer can include a multilayer stack of monolayer graphene domains. Adjacent monolayer graphene domains can be separated by a gap of at least two lattice constants a. The multilayer stack of monolayer graphene domains can include a vertical arrangement of each monolayer graphene domain, with at least some vertical overlap. That is, at least some of the carbon atoms in each monolayer graphene domain are positioned over and/or under some of the carbon atoms in another monolayer graphene domain. Regardless, while the quantum wells 12A-12H and barriers 14A-14H are shown including zero or one carbon doped layers, it is understood that a quantum well 12A-12H and a barrier 14A-14H can include any number of carbon doped layers. In an embodiment, a quantum well 12A-12H and/or a barrier 14A-14H can include up to ten carbon doped layers comprising stacks of carbon domains.

Figure 5:
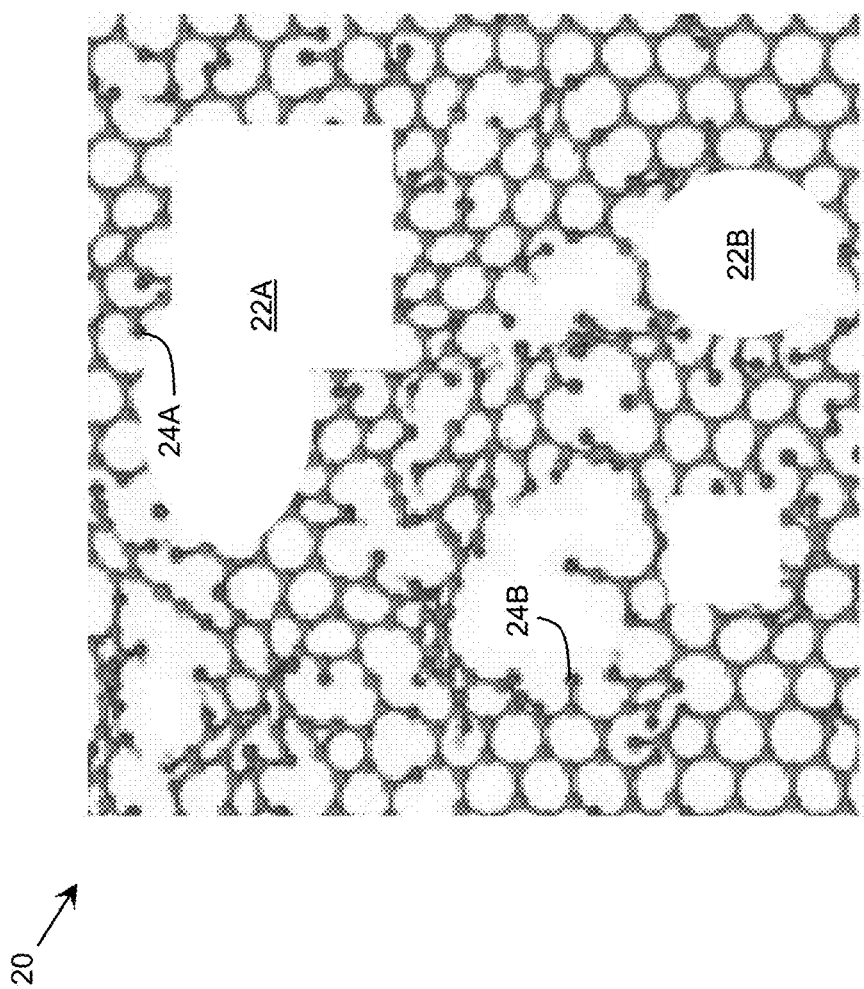
FIG. 5 shows an illustrative carbon doped layer (e.g., a percolated carbon atomic plane) comprising a monolayer of graphene domain according to an embodiment.

In an embodiment, the carbon delta doping 16A-16H, 18A-18H is a fraction of an atomic plane. In a more particular embodiment, the carbon delta doping 16A-16H, 18A-18H is a carbon doped layer, which is formed of an interconnected network of carbon atoms. For example, FIG. 5 shows an illustrative interconnected carbon doped layer 20 according to an embodiment. The carbon doped layer 20 can be deposited using any technique, such as thermal evaporation, magnetron sputtering, ion-beam deposition, laser beam evaporation, and/or the like. The carbon target used for deposition can include graphite, exfoliated graphene, and/or the like. In a more specific embodiment, the carbon delta doping is a fraction of an atomic plane. In a still more specific embodiment, the carbon doped layer is a percolated carbon atomic plane, such as a percolated graphene plane.

As illustrated, the interconnected carbon doped layer 20 (e.g., percolated or non-percolated) includes a monolayer graphene domain. The carbon doped layer 20 can include a set of openings, such as openings 22A, 22B, which cause the layer 20 to only partially cover a surface of the corresponding quantum well 12A-12H or barrier 14A-14H. In an embodiment, the interconnected carbon doped layer 20 is a percolated graphene plane. As used herein, a percolation network is a stochastically distributed network of carbon (e.g., graphene) dots and ribbons that form a contiguous conducting path between the boundaries of the carbon plane (e.g., the edges of the entire surface of the barrier/quantum well). In general, the carbon delta doping 16A-16H, 18A-18H can cover between approximately twenty and approximately forty percent of an area of the entire surface of the barrier/quantum well.

As mentioned above, the carbon doped layer 20 can include a delta doping profile. Delta-doped semiconductors can be grown by suspension of the regular crystal growth and evaporation of impurities on the crystal surface. Dopants may be confined to a single atomic plane if impurity diffusion and other broadening mechanisms are negligible and if the epitaxial crystal is atomically flat (e.g., contains no steps). However, the dopants may be distributed over several atomic planes and form an interconnected network in each single plane. One such interconnected network can be a percolated carbon atomic plane. However, the interconnected network can also include small percolated domains separated from each other by gaps or atomic steps. As used herein, an interconnected network is a stochastically distributed network of carbon (e.g., graphene) dots and ribbons that can form a contiguous conducting path (e.g., if the entire network is percolated) between the boundaries of the carbon plane 16A-16H, 18A-18H (e.g., the edges of the entire surface of the barrier/quantum well). As used herein, the terms "interconnected network", "interconnected domain", or similar expressions describe domains including multiple smaller percolated regions, separated from each other by gaps. The percolated region size can be at least several lattice constants measured in the basal plane of the semiconductor lattice (e.g., group III nitride) and gaps can be at least two lattice constants measured in a basal plane. Alternatively, gaps can be steps between several basal planes. Furthermore, a region comprising a group of dopant atoms is percolated if, for each dopant atom within the region, there is at least one dopant atom located within a distance comparable to a lattice constant a (e.g., a distance of approximately 0.5 a to approximately 1.5 a).

In an embodiment, a carbon doped layer forms a set of cluster domains, which can be percolated or non-percolated. For example, such domains can be located over a semiconductor layer including compositional inhomogeneities. In a more particular example, a semiconductor layer over which a carbon doped layer is located (e.g., grown) can contain regions with variable composition. Each variable composition region can have a corresponding characteristic average composition, which can be measured using any solution. For example, the composition at numerous relatively small area of the layer can be measured, and contours of constant composition can be evaluated. The contours of constant composition define compositional valleys and hills, and for each such valley and hill the lateral area size of the valley and hill can be calculated. An average of lateral sizes of valleys and hills comprises a characteristic lateral size of the compositional variation. The variation in composition can be present due to, for example, the epitaxial growth process used to grow the semiconductor layer, use of a patterning and overgrowth method, and/or the like. The characteristic lateral size can be in a range of 10 nanometers to 5 microns. Regardless, the cluster domains can have a characteristic lateral size comparable to that of the characteristic lateral size of the variable composition regions. Additionally, an average distance between the cluster domains can be similar to (e.g., within +/−10%) that of the characteristic lateral size of the cluster domains.

Furthermore, a carbon layer 16A-16H, 18A-18H can include dopants, such as dopants 24A, 24B. The dopant can comprise any type of dopant. Illustrative dopants include magnesium (Mg), fluorine (F), gold (Au), aromatic molecules, polar molecules, and/or the like. For p-type doping, Mg can be used with or without other co-dopants. In an embodiment, a target dopant combination can be selected based on a percentage of coverage of the doped plane using any solution.

An SPSL 10A-10C described herein can be utilized to perform any function within a heterostructure and/or device. For example, an embodiment provides a light emitting structure including one or more quantum wells and/or barriers comprising a carbon layer as described herein. In a more particular embodiment, the light emitting structure is a deep ultraviolet light emitting structure. Similarly, an SPSL 10A-10C described herein can be utilized as, for example, an integral part of an ohmic and/or Schottky contact, a cladding layer, a buffer layer, a barrier layer, and/or the like, for a corresponding device. In an embodiment, an SPSL 10A-10C described herein provides p-type conduction during normal operation of a corresponding device as part of a circuit.

Furthermore, it is understood that an SPSL 10A-10C described herein can be utilized in various types of devices, such as a light emitting diode (LED), a superluminescent diode, a laser, and/or the like. In an embodiment, the device is configured to emit ultraviolet radiation during operation (e.g., an ultraviolet LED, an ultraviolet superluminescent LED, and/or the like). In a more particular embodiment, the ultraviolet radiation comprises deep ultraviolet radiation, e.g., 210 nm to 365 nm.

To this extent, FIGS. 6A and 6B show illustrative heterostructures 30, 50 for vertically conducting LEDs according to embodiments. As illustrated in FIG. 6A, the heterostructure 30 can include a substrate 32, an n-type contact 34, a light generating structure 36, and a p-type contact 38. In an embodiment, the substrate 32 and n-type contact 34 are at least partially transparent to the light generated by the light generating structure 36, thereby enabling extraction of light generated by the light generating structure 36 out of the heterostructure 30 through the transparent substrate 32. In an alternative embodiment, the substrate 32 is removed from the heterostructure 30, thereby enabling extraction of the light generated by the light generating structure 36 out a bottom surface of the n-type contact 34. In either case, the heterostructure 30 can be utilized in the formation of a device using a flip chip configuration. For example, the heterostructure 30 can be attached to a mount via one or more bonding pads and/or solder bumps attached to the p-type contact 38. Furthermore, an external surface of the substrate 32 and/or n-type contact 34 can be textured to improve extraction of the light from the heterostructure 30.

Furthermore, the heterostructure 30 can include a distributed semiconductor heterostructure Bragg reflector (DBR) structure 40 on an opposing side of the light generating structure 36 than a transparent side of the heterostructure 30 (e.g., the transparent n-type contact 34). The DBR structure 40 can be configured to reflect additional light generated by the light generating structure 36 toward the transparent n-type contact 34 and/or substrate 32 than would otherwise be provided. Additionally, the heterostructure 30 can include an electron blocking layer 42 located between the DBR structure 40 and the light generating structure 36, which can suppress residual electron overflow from the n-type contact 34 to the p-type contact 38 without capture into the light generating structure 36. The electron blocking layer 42 can be configured to be at least partially transparent to the light generated by the light generating structure 36.

The various components of the heterostructure 30 can be formed from any suitable materials, such as group III nitride materials as described herein. In an embodiment, the n-type contact 34 is formed of a short period superlattice that is at least partially transparent to radiation generated by the light generating structure 36, which can provide a higher free hole concentration due to better dopant ionization, better crystal quality, and/or higher optical transmission to the emitted radiation. In a further embodiment, the n-type contact 34 (e.g., the short period superlattice) is formed of group III nitride materials.

The carbon delta doping described herein can be utilized for any layer or semiconductor structure of the heterostructure 30. For example, the light generating structure 36 can comprise a series of quantum wells and barriers, at least some of which include the carbon delta doping described herein. In an embodiment, the graphene doping described herein is included at the n-type contact 34 and/or the p-type contact 38. For example, the n-type contact 34 and/or the p-type contact 38 can be formed of a short period superlattice including the graphene doping described herein. Furthermore, the n-type contact 34 and/or the p-type contact 38 can include a thin layer of metal adjacent to the graphene, which can improve current spreading in the n-type contact 34 and/or the p-type contact 38.

As shown in FIG. 6B, a heterostructure 50 for a vertically conducting LED (e.g., a deep ultraviolet light emitting diode), can further include a buffer layer 52 located between the substrate 32 and the n-type contact 34. In an embodiment, the buffer layer 52 includes a carbon doped or carbon rich layer deposited therein. More particularly, such a carbon doped layer can be deposited in a proximity of an interface between the buffer layer 52 and a subsequently grown semiconductor layer, such as the n-type contact 34, which frequently comprises aluminum nitride. Such a carbon doped layer can serve as, for example, a stress controlling layer and/or a layer suppressing formation of dislocations at the interface of two semiconductor layers, such as the buffer layer 52 and the n-type contact 34.

In another embodiment, a set of carbon doped layers described herein can be placed within an n-type layer 34 accompanied with an n-type doping either in combination with the carbon doped layer or having dopants between the carbon doped layers. Regardless, the presence of carbon doped layer within the n-type semiconductor layer can result in an increased lateral conductivity of such layer. In an embodiment, the carbon doped layer can be placed in proximity of an $Al_xGa_{1-x}N/Al_yGa_{1-y}N$ superlattice at a distance sufficiently close to the 2D gas formed at the interface of such layers to allow carrier tunneling from the 2D gas region to the carbon doped layer region. Similar to placing the carbon doped layer(s) within the n-type region, a set of carbon doped layers can be placed within p-type region accompanied by p-type doping.

In addition, the carbon doped layer can be placed in proximity of an interface of a semiconductor layer and the electron blocking layer 42. For instance, the heterostructure 50 is shown including a stress relieving layer 54, which can comprise a carbon doped layer described herein located between the light generating structure 36 and the electron blocking layer 42 in order to reduce stress build up between these two semiconductor layers. Furthermore, a stress relieving carbon doped layer can be placed between the electron blocking layer 42 and the p-type contact layer 38. In an embodiment, the carbon doped layer can be placed at any point in the heterostructure 50 where the changes in composition in semiconductor layers are above values leading to large epitaxial stresses. For example, the carbon blocking layer can be placed between adjacent semiconductor layers, within one or more locations of a graded semiconductor layer, and/or the like, where a lattice mismatch strain exceeds 0.2%. Furthermore, the carbon doped layer can be placed within a semiconductor structure at an interface of two semiconductor layers wherein a change in molar fraction in at least one element (e.g., a group III element) between the two semiconductor layers is larger than 5%.

It is understood that a semiconductor device described herein can be manufactured using any solution. For example, a device heterostructure 30 can be formed using any solution, e.g., by obtaining (e.g., forming, preparing, acquiring, and/or the like) a substrate 32, forming (e.g., growing, depositing, adhering, and/or the like) an n-type contact 34 thereon, forming a light generating structure 36 thereon, and forming a p-type contact 38 on the light generating structure 36. Additional layers, such as a DBR structure 40, an electron blocking layer 42, and/or the like, can be formed in the heterostructure 30. Additionally, metal electrode(s), dielectric layer(s), and/or the like, can be formed on the device heterostructure 30 using any solution.

The formation of a layer or structure in the heterostructure 30 can include forming an SPSL as described herein. In this case, a semiconductor structure, such as a quantum well 12A-12H (FIG. 3) or a barrier 14A-14H (FIG. 3) can be carbon doped using any solution. For example, a portion of the semiconductor structure can be formed (e.g., grown) and the carbon layer can be formed on a surface thereof using any solution. Formation of the carbon layer can include, for example, incorporating one or more types of dopants in the carbon layer using any solution. Subsequently, formation of the semiconductor structure can continue on the carbon layer. It is understood that the manufacture of a device described herein can include additional processing, including for example: the deposition and removal of a temporary layer, such as mask layer or the substrate 32; the patterning and/or roughening of one or more layers; the formation of one or more additional layers/contacts not shown; application to a submount (e.g., via contact pads); and/or the like.

While shown and described herein as a method of designing and/or fabricating a semiconductor device, it is understood that aspects of the invention further provide various alternative embodiments. For example, in one embodiment, the invention provides a method of designing and/or fabricating a circuit that includes one or more of the semiconductor devices designed and fabricated as described herein.

Figure 7:
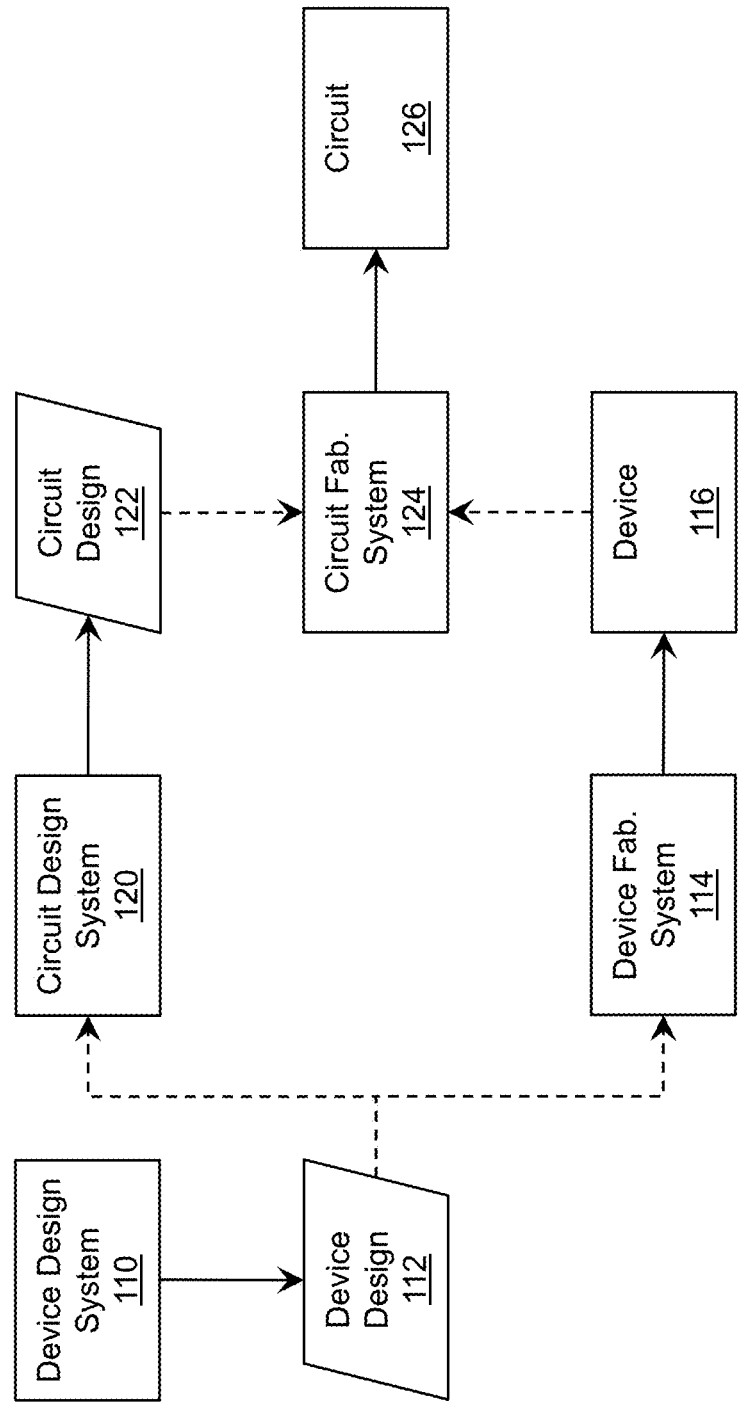
FIG. 7 shows an illustrative flow diagram for fabricating a circuit according to an embodiment.

To this extent, FIG. 7 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A group III nitride semiconductor heterostructure comprising:
   a short period superlattice comprising a plurality of quantum wells alternating with a plurality of barriers, wherein the plurality quantum wells comprise a semiconductor material having a first band gap and the plurality of barriers comprise a semiconductor material having a second band gap wider than the first band gap, and wherein at least one of: a well of the plurality of quantum wells or a barrier of the plurality of barriers, comprises at least two dopants embedded therein, wherein a first dopant of the at least two dopants is carbon.

2. The heterostructure of claim 1, wherein at least one of: the plurality of quantum wells or the plurality of barriers includes boron.

3. The heterostructure of claim 1, wherein a second dopant of the at least two dopants is magnesium.

4. The heterostructure of claim 1, wherein the short period superlattice includes n-type doping.

5. The heterostructure of claim 1, wherein the at least one of: the well of the plurality of quantum wells or the barrier of the plurality of barriers is delta doped with carbon.

6. The heterostructure of claim 1, wherein the first dopant forms laterally inhomogeneous domains.

7. The heterostructure of claim 1, wherein the heterostructure further includes a light generating structure having an n-type side and a p-type side, and wherein the short period superlattice is located on the p-type side.

8. The heterostructure of claim 7, wherein the short period superlattice is located between the light generating structure and an electron blocking layer.

9. A group III nitride semiconductor light emitting device comprising:
   a short period superlattice comprising a first plurality of sub-layers alternating with a second plurality of sub-layers, wherein the first plurality of sub-layers comprise a semiconductor material having a first band gap and the second plurality of sub-layers comprise a semiconductor material having a second band gap wider than the first band gap, and wherein at least one of: the first or second pluralities of sub-layers comprises sub-layers having regions including at least two dopants embedded therein, wherein a first dopant of the at least two dopants is carbon, and laterally adjacent regions including no carbon.

10. The device of claim 9, wherein at least one of the first or second pluralities of sub-layers includes boron.

11. The device of claim 9, wherein a second dopant of the at least two dopants is magnesium.

12. The device of claim 9, wherein the first dopant forms laterally inhomogeneous domains.

13. The device of claim 9, wherein the short period superlattice further includes n-type doping.

14. The device of claim 9, further comprising a light generating structure having an n-type side and a p-type side, and wherein the short period superlattice is located on the p-type side.

15. The device of claim 14, wherein the short period superlattice is located between the light generating structure and an electron blocking layer.

16. A method of fabricating a light emitting diode, the method comprising:
   fabricating a group III nitride semiconductor heterostructure, the fabricating including forming a short period superlattice comprising a plurality of quantum wells alternating with a plurality of barriers, wherein the plurality quantum wells comprise a semiconductor material having a first band gap and the plurality of barriers comprise a semiconductor material having a second band gap wider than the first band gap, and wherein the forming at least one of: a well of the plurality of quantum wells or a barrier of the plurality of barriers includes embedding at least two dopants therein, wherein a first dopant of the at least two dopants is carbon.

17. The method of claim 16, wherein the fabricating further includes forming a light generating structure configured to emit deep ultraviolet light, wherein the short period superlattice is located on a p-type side of the light generating structure.

18. The method of claim 16, wherein the embedding includes delta doping with carbon.

19. The method of claim 16, wherein the first dopant forms laterally inhomogeneous domains.

20. The method of claim 16, wherein the embedding includes embedding at least one of: the plurality of quantum wells or the plurality of barriers with boron.

* * * * *